(12) United States Patent
Nishioka

(10) Patent No.: US 7,183,655 B2
(45) Date of Patent: Feb. 27, 2007

(54) PACKAGED SEMICONDUCTOR DEVICE

(75) Inventor: Kei Nishioka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 52 days.

(21) Appl. No.: 10/682,921

(22) Filed: Oct. 14, 2003

(65) Prior Publication Data

US 2004/0075176 A1    Apr. 22, 2004

(30) Foreign Application Priority Data

Oct. 17, 2002  (JP) ............................. 2002-303093

(51) Int. Cl.
*H01L 23/48* (2006.01)
*H01L 23/52* (2006.01)
*H01L 29/40* (2006.01)

(52) U.S. Cl. ...................... 257/777; 257/686

(58) Field of Classification Search ............. 257/777, 257/686, 784, 778, 780, 781
See application file for complete search history.

(56) References Cited

U.S. PATENT DOCUMENTS 6,057,598 A * 5/2000 Payne et al. ................ 257/723
6,239,366 B1 * 5/2001 Hsuan et al. ............... 174/52.3
6,420,787 B1 * 7/2002 Kobayashi et al. .......... 257/777
6,462,420 B2 * 10/2002 Hikita et al. ................ 257/777
6,734,556 B2 * 5/2004 Shibata ...................... 257/737
6,781,247 B2 * 8/2004 Shibata ...................... 257/781

FOREIGN PATENT DOCUMENTS

| JP | 05-226420 | 9/1993 |
| JP | 07-321162 | 12/1995 |
| JP | 10-270498 | 10/1998 |
| JP | 11-186324 | 7/1999 |
| JP | 2000-012733 | 1/2000 |
| JP | 2000-223652 | 8/2000 |
| JP | 2001-217371 | 8/2001 |

* cited by examiner

Primary Examiner—S. V. Clark
(74) Attorney, Agent, or Firm—Arent Fox PLLC

(57) ABSTRACT

A packaged semiconductor device has an integrated chip and a non-integrated chip. The integrated chip has an integrated circuit and first bump pads formed with a narrow pitch. The non-integrated chip has second bump pads formed so as to face the first bump pads, lead pads formed with a wide pitch (so as to permit connection thereto of wires), and wiring conductors electrically connecting these pads together. The two chips are connected together by way of bumps and are then sealed in resin. With this structure, it is possible to realize a low-cost packaged semiconductor device that can easily be mounted on a mother board.

6 Claims, 2 Drawing Sheets

PACKAGED SEMICONDUCTOR DEVICE

BACKGROUND OF THE INVENTION

1. Field of the Invention

The present invention relates to a packaged semiconductor device that is surface-mounted on a mother board.

2. Description of the Prior Art

A conventional packaged semiconductor device includes an integrated circuit formed on a semiconductor substrate such as a silicon wafer so as to realize device functions, lead connection pads (hereinafter referred to as pads) formed at predetermined intervals (so as to permit the bonding thereto of wires connecting to leads), protection circuits for preventing electrostatic destruction of the integrated circuit, wiring that electrically connects the pads to the integrated circuit by way of the projection circuits, and a protective film that covers all these components except the pads. All these are sealed in resin (see, for example, Japanese Patent Application Laid-Open No. 2001-217371).

The most effective way to reduce the cost of a packaged semiconductor device structured as described above is to reduce the size of the semiconductor substrate so as to increase the number of chips cut out of a single wafer and thereby reduce the unit cost. To achieve this, conventionally, techniques for making finer the process of forming integrated circuits have been eagerly developed for the purpose of increasing the integration density of integrated circuits.

It is true that, in a packaged semiconductor device structured as described above, increasing the integration density of the integrated circuit helps reduce the size of the semiconductor substrate and reduce the cost to a certain degree.

However, inconveniently, in a packaged semiconductor device structured as described above, when the integration density of the integrated circuit reaches a certain level, the size of the semiconductor substrate can no longer be reduced and therefore the cost can no longer be reduced because of the dimensions that need to be secured in the I/O region (the intervals at which the pads are formed and the depth of the protection circuits (the dimension thereof in the direction from the edge toward the middle of the substrate)). Considering the wire bonding accuracy today, the pads need to be formed at intervals of at least 110 to 140 μm. Moreover, considering the fact that the protection circuits cannot be formed right below the pads, where a high stress is applied during wire bonding, the I/O region needs to be at least several hundred μm deep.

As described above, in a packaged semiconductor device structured as described above, increasing the integration density of the integrated circuit from the current level with the development in the techniques of forming semiconductor chips results only in increasing the space for wiring, and does not lead to cost reduction. On the contrary, quite in a dilemma, the higher integration density requires more expensive fabrication equipment and thus increases the fabrication cost, and in addition lowers the yield rate. In some conventionally available products, the free space created as a result of the increased integration density is used to mount a memory array or the like to achieve higher cost performance. This structure, however, does not contribute to fundamental cost reduction, and therefore does not meet the user needs for further cost reduction.

Incidentally, in a packaged semiconductor device (see, for example, Japanese Patent Application Laid-Open No. 2000-223652) composed of a mother chip and a daughter chip connected together by way of bumps so as to form a chip-on-chip structure, the size of the daughter chip, which does not require pads for wire bonding, can be reduced as the integration density is increased. However, the purpose of adopting the chip-on-chip structure is to integrate together a plurality of chips fabricated by different processes, or to minimize the increase in the chip area resulting from larger-scale integrated circuits (through conversion to a vertical structure), or to enhance the productivity of different models by interchange of daughter chips. Thus, in a packaged semiconductor device having this structure, a large-scale integrated circuit is formed, quite naturally, also on the mother chip, and therefore, with the chip-on-chip structure, it is possible to reduce the cost of the daughter chip, but not the cost of the mother chip.

Also conventionally available are packaged semiconductor devices that adopt the techniques called CSP (chip scale package) and BGA (ball grid array) (see, for example, Japanese Patent Application Laid-Open No. 2000-012733) to reduce size and thereby reduce cost. However, to mount a packaged semiconductor device having such a structure directly on a mother board, it is necessary to use equipment that can accurately control its mounting position by camera recognition or the like, and introducing such equipment requires a large capital investment. This makes it difficult for a user with a small capital to introduce packaged semiconductor devices structured as described above.

SUMMARY OF THE INVENTION

An object of the present invention is to provide an inexpensive packaged semiconductor device that can easily be mounted on a mother board.

To achieve the above object, according to the present invention, a packaged semiconductor device is provided with: at least one integrated chip having an integrated circuit for realizing a device function and first bump connection pads formed at predetermined intervals; and a non-integrated chip having second bump connection pads formed so as to face the first bump connection pads, lead connection pads formed at intervals greater than the predetermined intervals; and wiring conductors for electrically connecting together the second bump connection pads and the lead connection pads. Here, the integrated and non-integrated chips are connected together by way of bumps and are then sealed in resin.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1A:
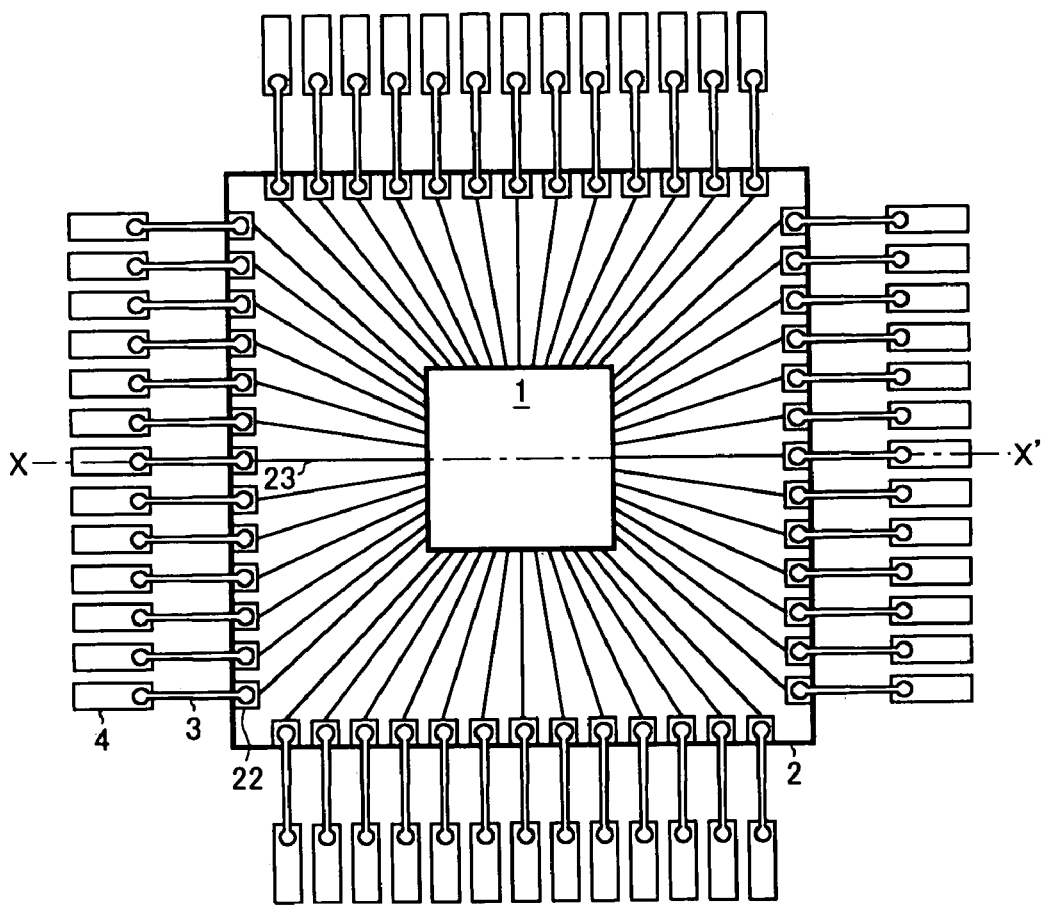
FIGS. 1A and 1B are diagrams showing an outline of the structure of a packaged semiconductor device embodying the invention.
Figure 1B:
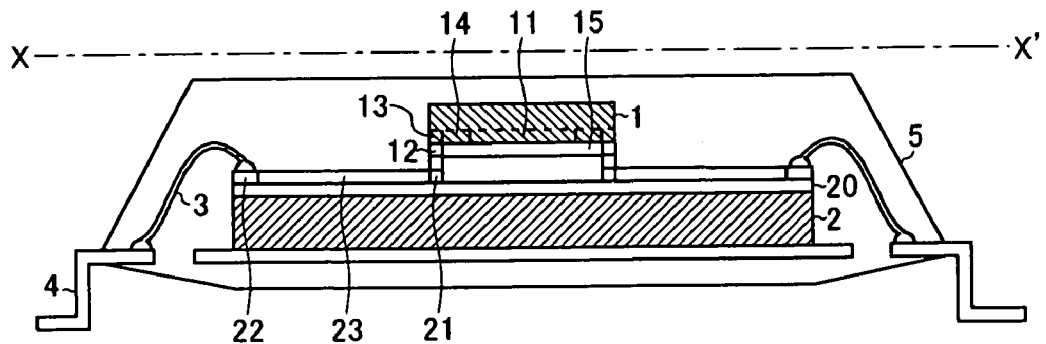

FIGS. 1A and 1B are diagrams showing an outline of the structure of a packaged semiconductor device embodying the invention. FIG. 1A is a top view, and FIG. 1B is a sectional view taken along line X–X' shown in FIG. 1A. As shown in these diagrams, the packaged semiconductor device of this embodiment has an integrated chip 1 and a non-integrated chip 2. The two chips are connected together by way of bumps so as to form a chip-on-chip structure, and are then sealed in resin 5.

In the packaged semiconductor device structured as described above, on the integrated chip 1, which is formed of a silicon wafer or the like, there are formed an integrated circuit 11 for realizing device functions, first bump connection pads 12 (hereinafter referred to as the first bump pads 12) formed at predetermined intervals, protection circuits 13 for preventing electrostatic destruction of the integrated circuit 11, wiring conductors 14 for electrically connecting the first bump pads 12 to the integrated circuit 11 by way of the protection circuits 13, and a protective film 15 for covering all these components except the first bump pads 12.

On the other hand, the non-integrated chip 2 is a chip that has almost the same expansion coefficient as the integrated chip 1 but that, as opposed to the integrated chip 1, is not subjected to semiconductor processes such as selective impurity diffusion. On the surface of the non-integrated chip 2, there is formed an insulating film 20, and, on this insulating film 20, there are formed second bump connection pads 21 (hereinafter referred to as the second bump pads 21) formed so as to face the first bump pads 12, lead connection pads 22 (hereinafter referred to as the lead pads 22) formed at intervals greater than the aforementioned predetermined intervals (so as to permit the bonding thereto of wires 3 connecting to leads 4), and wiring conductors 23 for electrically connecting together the second bump pads 21 and the lead pads 22. Incidentally, in a case where the non-integrated chip 2 itself is formed of an insulating material (a glass substrate or the like), there is no need to form the insulating film 20.

As described above, the packaged semiconductor device of this embodiment is separated into the integrated chip 1, on which is independently formed the integrated circuit 11, of which the size is expected to be further reduced as techniques for fabricating semiconductor chips develop, and the non-integrated chip 2, on which are formed the lead pads 22, of which the size is not expected to be further reduced because of the intervals at which they need to be formed.

This structure permits the size of the integrated chip 1 to be reduced as the integration density of the integrated circuit 11 is increased and for the purpose stated later. This helps reduce the unit cost of the integrated chip 1, and thus helps reduce the cost of the packaged semiconductor device as a whole. Specifically, the process of connecting bumps, as compared with the process of wire bonding, is less likely to cause damage to around the pads. This permits the protection circuits 13 to be formed right below the bump pads (in this embodiment, right above the first bump pads 12), and permits the pads to be given smaller size than for wire bonding. Thus, it is possible to reduce the size of the non-integrated chip 2 accordingly. Moreover, by separating the integrated circuit, which is composed of a plurality of arrays, into a plurality of integrated chips, it is possible to prevent the lowering of the yield rate of one integrated chip from significantly affecting the yield rate of the packaged semiconductor device as a whole. This contributes to cost reduction of the packaged semiconductor device as a whole.

Moreover, in the packaged semiconductor device of this embodiment, just as in a packaged semiconductor device having a conventional structure, electrical connection with a mother board is achieved by way of leads 4 that run out of the package with a wide pitch. With a packaged semiconductor device having such a structure, it is not necessary to control its mounting position extremely accurately, and therefore it is possible to mount the packaged semiconductor device on a mother board by the use of existing mounting equipment. Thus, this packaged semiconductor device, as compared with those adopting CSP or BGA, helps minimize the capital investment that the user needs to make to introduce it.

Moreover, in the packaged semiconductor device of this embodiment, on the non-integrated chip 2 are formed only the pads 21 and 22 and the wiring conductors 23, and no integrated circuit at all. With this structure, it is possible to use, as the material of the substrate of the non-integrated chip 2, an inexpensive plate-shaped member having the minimum required physical strength (such as a dummy silicon or glass substrate), and in addition it is possible to keep the yield rate thereof at almost 100%. This helps greatly reduce the unit cost of the non-integrated chip 2 as compared with that of the integrated chip 1, and this, in combination with the integrated chip 1 made smaller, helps reduce the cost of the packaged semiconductor device as a whole. Incidentally, since no consideration needs to be given to the distortion occurring in the devices formed on the non-integrated chip 2, if it is important to reduce the thickness of the packaged semiconductor device as a whole, the thickness of the non-integrated chip 2 may be made thin down to the limit of its physical strength.

Figure 2:
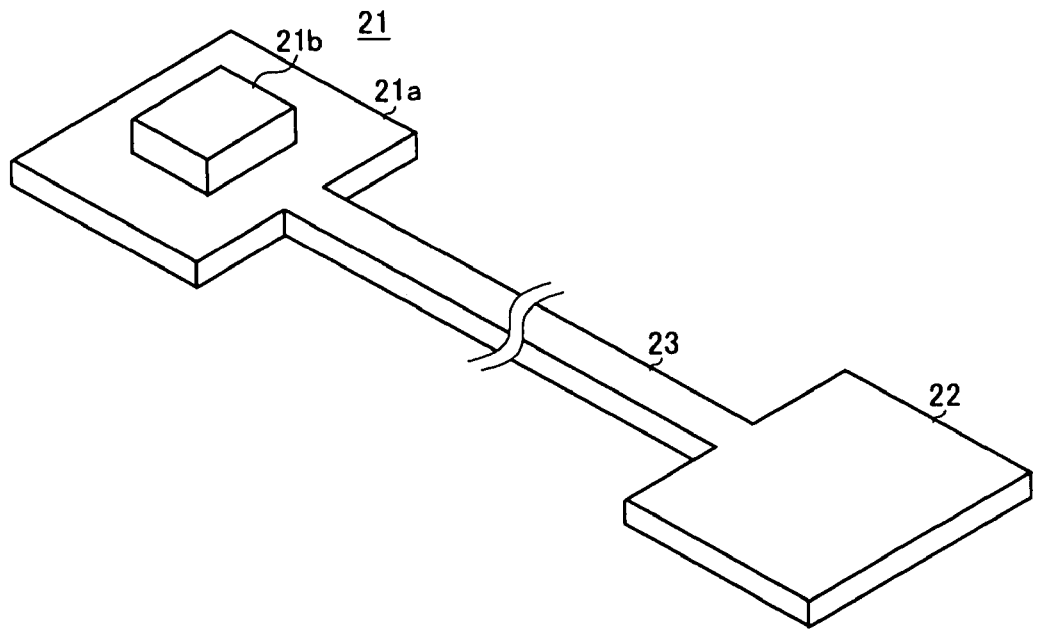
FIG. 2 is a perspective view showing an example of how the pads 21 and 22 and the wiring conductor 23 are integrally formed.

The packaged semiconductor device of this embodiment will be further explained. As shown in FIG. 2, in the packaged semiconductor device of this embodiment, the second bump pads 21 and the lead pads 22 are individually formed integrally with the wiring conductors 23 (in this embodiment, first, a 6 μm thick conductive metal film is formed, then resist is applied thereto, and then it is etched). With this structure, it is possible to simplify the IC fabrication process as compared with the common one whereby wiring patterns and pads are formed on a semiconductor chip while alignment relative to internal devices is repeatedly performed. This helps reduce the unit costs of the non-integrated chip 2 and the integrated chip 1 as compared with a case where wire bonding pads and protection circuits are formed on the integrated chip 1 as conventionally practiced. This leads to cost reduction of the packaged semiconductor device as a whole.

Figure 3:
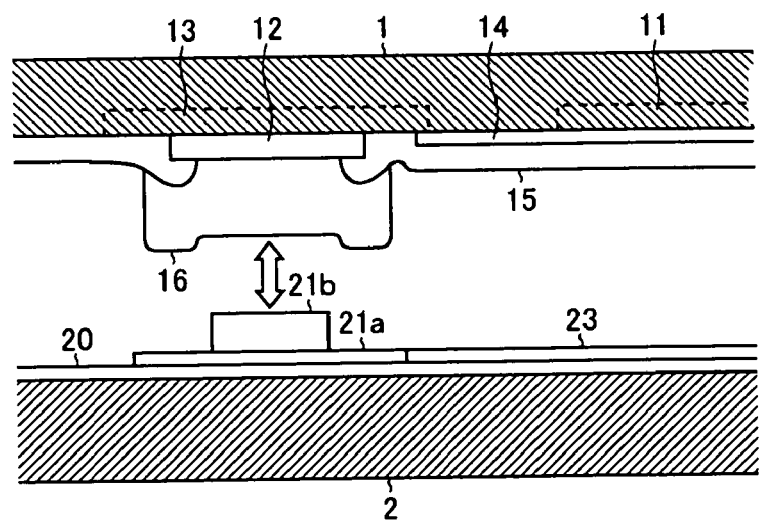
FIG. 3 is a sectional view showing an example of how the chips 1 and 2 are connected together by way of bumps.

Moreover, in the packaged semiconductor device of this embodiment, as shown in FIGS. 2 and 3, the second bump pads 21 each have a central portion thereof elevated so as to have two levels (specifically, a first-level pad 21a and a second-level pad 21b). With this structure, even when a swell in the protective film 15 around a first pad 12 leaves a bump 16 higher at the edge than at the center thereof, the bump 16 is joined to a second bump pad 21 not only at the edge but also at the center thereof. This helps increase the bonding strength between the two chips 1 and 2.

As described above, according to the present invention, a packaged semiconductor device is provided with: at least one integrated chip having an integrated circuit for realizing a device function and first bump connection pads formed at predetermined intervals; and a non-integrated chip having second bump connection pads formed so as to face the first bump connection pads, lead connection pads formed at intervals greater than the predetermined intervals; and wiring conductors for electrically connecting together the second bump connection pads and the lead connection pads. Here, the integrated and non-integrated chips are connected together by way of bumps and are then sealed in resin. With this structure, it is possible to realize an inexpensive packaged semiconductor device that can easily be mounted on a mother board.

In the packaged semiconductor device structured as described above, advisably, at least either the second bump connection pads or the lead connection pads are formed integrally with the wiring conductors. With this structure, it is possible to form the wiring conductors along with the pads. This helps reduce the unit cost of the non-integrated chip, and thus contributes to the cost reduction of the packaged semiconductor device as a whole.

In the packaged semiconductor device structured as described above, advisably, the second bump connection pads each have a central portion thereof elevated so as to have two levels. With this structure, even when a bump joined to a first bump connection pad is left higher at the edge than at the center thereof, the bump is joined to a second bump connection pad not only at the edge but also at the center thereof. This helps increase the bonding strength between the integrated and non-integrated chips.

What is claimed is:

1. A packaged semiconductor device comprising:
at least one integrated chip having formed thereon:
an integrated circuit for realizing a device function, and
first bump connection pads formed at predetermined intervals; and
a non-integrated chip having formed thereon only:
second bump connection pads formed so as to face the first bump connection pads,
lead connection pads formed at intervals greater than the predetermined intervals; and
wiring conductors for electrically connecting together the second bump connection pads and the lead connection pads,
wherein no integrated circuit requiring a semiconductor process such as selective impurity diffusion is formed on the non-integrated chip and the integrated and non-integrated chips are connected together by way of bumps and are then sealed in resin, and
wherein the second bump connection pads each have a central portion thereof elevated so as to have two levels so that, when the second bump connection pads are seen in a plan view, higher-level portions thereof have a smaller area than lower-level portions thereof.

2. A packaged semiconductor device as claimed in claim 1,
wherein at least either the second bump connection pads or the lead connection pads are formed integrally with the wiring conductors.

3. A packaged semiconductor device as claimed in claim 1,
wherein a substrate of the non-integrated chip is a dummy silicon substrate or glass substrate.

4. A packaged semiconductor device as claimed in claim 1,
wherein the intervals at which the lead connection pads are formed are such as to permit bonding thereto of wires connecting to leads.

5. A packaged semiconductor device comprising:
an integrated chip; and
a non-integrated chip formed by a process other than a semiconductor formation process,
wherein the integrated chip comprises an integrated circuit for realizing a device function and a plurality of first bump connection pads formed at predetermined intervals,
wherein the non-integrated chip comprises a plurality of second bump connection pads, the plurality of second bump connection pads extending opposite the first bump connection pads, a plurality of lead connection pads formed at intervals greater than the predetermined intervals, and wiring conductors for electrically connecting pairs of the second bump connection pads and the lead connection pads,
wherein the integrated and non-integrated chips are connected, and
wherein the second bump connection pads each have a central portion thereof elevated so as to have two levels so that, when the second bump connection pads are seen in a plan view, higher-level portions thereof have a smaller area than lower-level portions thereof.

6. A packaged semiconductor device comprising:
an integrated chip; and
a non-integrated chip formed by a process other than selective impurity diffusion,
wherein the integrated chip comprises an integrated circuit for realizing a device function and a plurality of first bump connection pads formed at predetermined intervals,
wherein the non-integrated chip comprises a plurality of second bump connection pads, the plurality of second bump connection pads extending opposite the first bump connection pads, a plurality of lead connection pads formed at intervals greater than the predetermined intervals, and wiring conductors for electrically connecting pairs of the second bump connection pads and the lead connection pads,
wherein the integrated and non-integrated chips are connected, and
wherein the second bump connection pads each have a central portion thereof elevated so as to have two levels so that, when the second bump connection pads are seen in a plan view, higher-level portions thereof have a smaller area than lower-level portions thereof.

* * * * *